US008653852B2

(12) United States Patent
Lin et al.

(10) Patent No.: US 8,653,852 B2
(45) Date of Patent: *Feb. 18, 2014

(54) VOLTAGE LEVEL SHIFTER WITH DYNAMIC CIRCUIT STRUCTURE HAVING DISCHARGE DELAY TRACKING

(75) Inventors: Jentsung Lin, Cardiff by the Sea, CA (US); Paul Douglas Bassett, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/047,331

(22) Filed: Mar. 14, 2011

(65) Prior Publication Data

US 2011/0193609 A1  Aug. 11, 2011

Related U.S. Application Data

(63) Continuation of application No. 12/701,754, filed on Feb. 8, 2010, now Pat. No. 7,986,165.

(51) Int. Cl.
*H03K 19/0175* (2006.01)
*H03K 19/096* (2006.01)

(52) U.S. Cl.
USPC .................................. 326/63; 326/68; 326/95

(58) Field of Classification Search
USPC ............... 326/93, 97, 85, 98, 63, 68; 327/333
See application file for complete search history.

(56) References Cited

U.S. PATENT DOCUMENTS

| | | | |
|---|---|---|---|
| 6,404,235 B1 | 6/2002 | Nowka et al. | |
| 6,515,503 B2 * | 2/2003 | Griffin et al. | 326/30 |
| 6,842,046 B2 * | 1/2005 | Tzartzanis et al. | 326/98 |
| 6,894,528 B2 | 5/2005 | Gauthier et al. | |
| 7,002,375 B2 | 2/2006 | Hsu et al. | |
| 7,202,704 B2 | 4/2007 | Chu et al. | |
| 7,307,457 B2 | 12/2007 | Braceras et al. | |
| 7,362,621 B2 | 4/2008 | Chatterjee et al. | |
| 7,573,300 B2 | 8/2009 | Abadeer et al. | |
| 7,977,977 B1 * | 7/2011 | Natarajan et al. | 326/98 |
| 2004/0150447 A1 * | 8/2004 | Chang | 327/175 |
| 2006/0001442 A1 | 1/2006 | Wood et al. | |
| 2006/0103430 A1 * | 5/2006 | Yuan et al. | 326/97 |
| 2009/0096485 A1 | 4/2009 | Marshall | |

FOREIGN PATENT DOCUMENTS

WO    WO2006025025 A1    3/2006

OTHER PUBLICATIONS

U.S. Appl. No. 12/701,754, filed Feb. 8, 2010, Lin, Jentsung et al.
Cornelius, Claas et al. "Dynamic Circuit Techniques in Deep Submicron Technologies: Domino Logic Reconsidered," IEEE International Conference on Integrated Circuit Design and Technology, Padova, Italy, 2006, 4 pages.

(Continued)

*Primary Examiner* — Daniel D Chang
(74) *Attorney, Agent, or Firm* — Peter Michael Kamarchik; Nicholas J. Pauley; Joseph Agusta

(57) ABSTRACT

In a particular embodiment, an apparatus includes a a dynamic circuit structure that includes a dynamic node coupling a precharge circuit, a discharge circuit, and a gated keeper circuit. The gated keeper circuit is enabled by a signal from a discharge delay tracking circuit.

43 Claims, 8 Drawing Sheets

(56) References Cited

OTHER PUBLICATIONS

Dadgour, Hamed F. "A Novel Variation-Aware Low-Power Keeper Architecture for Wide Fan-In Dynamic Gates," Design Automation Conference, Jul. 24-28, 2006, San Francisco, CA, pp. 977-982.

Kulkarni, Jaydeep Prakash et al. "A Low Power High Performance Multiplexed Keeper Technique," ECE Department, Purdue University, West Lafayette, IN, Feb. 2006, 10 pages.

International Search Report and Written Opinion—PCT/US2011/024056—ISA/EPO—Apr. 27, 2011.

* cited by examiner

VOLTAGE LEVEL SHIFTER WITH DYNAMIC CIRCUIT STRUCTURE HAVING DISCHARGE DELAY TRACKING

I. CLAIM OF PRIORITY

The present application claims priority from and is a continuation of pending U.S. patent application Ser. No. 12/701,754, filed Feb. 8, 2010, the content of which is incorporated by reference herein in its entirety.

II. FIELD

The present disclosure is generally related to a voltage level shifting circuit.

III. DESCRIPTION OF RELATED ART

Advances in technology have resulted in smaller and more powerful personal computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet Protocol (IP) telephones, can communicate voice and data packets over wireless networks. Many such wireless telephones incorporate additional devices to provide enhanced functionality for end users. For example, a wireless telephone can also include a digital still camera, a digital video camera, a digital recorder, and an audio file player. Each of these portable personal computing devices may include a variety of different electronic devices all of which consume some amount of power.

Integrated circuits used in portable personal computing devices may employ multiple voltage domains. For example, circuitry in a "high" voltage domain can operate with higher supply voltage (Vdd_H) than circuitry in a "low" voltage domain that operates using a lower supply voltage (Vdd_L). To illustrate, logic circuitry may operate at a lower supply voltage than core memory circuitry.

Voltage level shifters operate to convert a signal from a voltage level corresponding to a logic level (i.e. a logic "high" or a logic "low" signal) in one voltage domain to a voltage level corresponding to the logic level in another voltage domain. Conventionally, a voltage level shifter is designed based on the specific values of the supply voltages of the voltage domains and/or a difference between the supply voltages. Thus, it would be advantageous to design a voltage level shifter capable of operation across a range of voltage domains.

IV. SUMMARY

In a particular embodiment, a voltage level shifter is disclosed. The voltage level shifter includes a dynamic circuit structure configured to receive an input signal from a first voltage domain and to provide an output signal to a second voltage domain. The dynamic circuit structure comprises a dynamic node coupling a first precharge circuit, a first discharge circuit, and a gated keeper circuit. The voltage level shifter also includes a discharge delay tracking circuit to send a signal to enable the gated keeper circuit of the dynamic circuit structure in response to detecting a discharge of a node of a second dynamic circuit structure. The dynamic circuit structure and the discharge delay tracking circuit may each be responsive to a clock signal from the second voltage domain.

In a particular embodiment, an apparatus is disclosed that includes a dynamic circuit structure and a discharge delay tracking circuit. The dynamic circuit structure includes a dynamic node coupling a first precharge circuit, a first discharge circuit, and a gated keeper circuit. The discharge delay tracking circuit includes circuitry to send a signal to enable the gated keeper circuit of the dynamic circuit structure in response to detecting a discharge of a node of a second dynamic circuit structure. In a particular embodiment, the delay discharge tracking circuit enables the gated keeper circuit based on circuitry that mimics or estimates a discharge time of the dynamic node of the dynamic circuit structure across different voltage domains.

In another embodiment, a method of controlling timing of a dynamic circuit is disclosed. The method includes generating an enable signal after a delay subsequent to detecting a discharge of a dynamic tracking node of a second dynamic circuit. The second dynamic circuit shares a common clock with the dynamic circuit. The method also includes applying the enable signal to a gated keeper circuit of the dynamic circuit to enable the gated keeper circuit of the dynamic circuit after the discharge of the dynamic tracking node.

One particular advantage provided by at least one of the disclosed embodiments is a voltage level shifter capable of operation across a variety of voltage domains by using the keeper circuit of a dynamic circuit structure that is enabled after discharge of the dynamic node of the dynamic circuit structure. Thus, timing of the keeper circuit tracks a discharge time of the dynamic node and reduces or eliminates effects due to early enable of the keeper circuit, such as lowering of a voltage shifting operating limit and speed, and effects due to late enable of the keeper circuit, such as voltage drop due to pull-down leakage.

V. BRIEF DESCRIPTION OF THE DRAWINGS

VI. DETAILED DESCRIPTION

Figure 1:
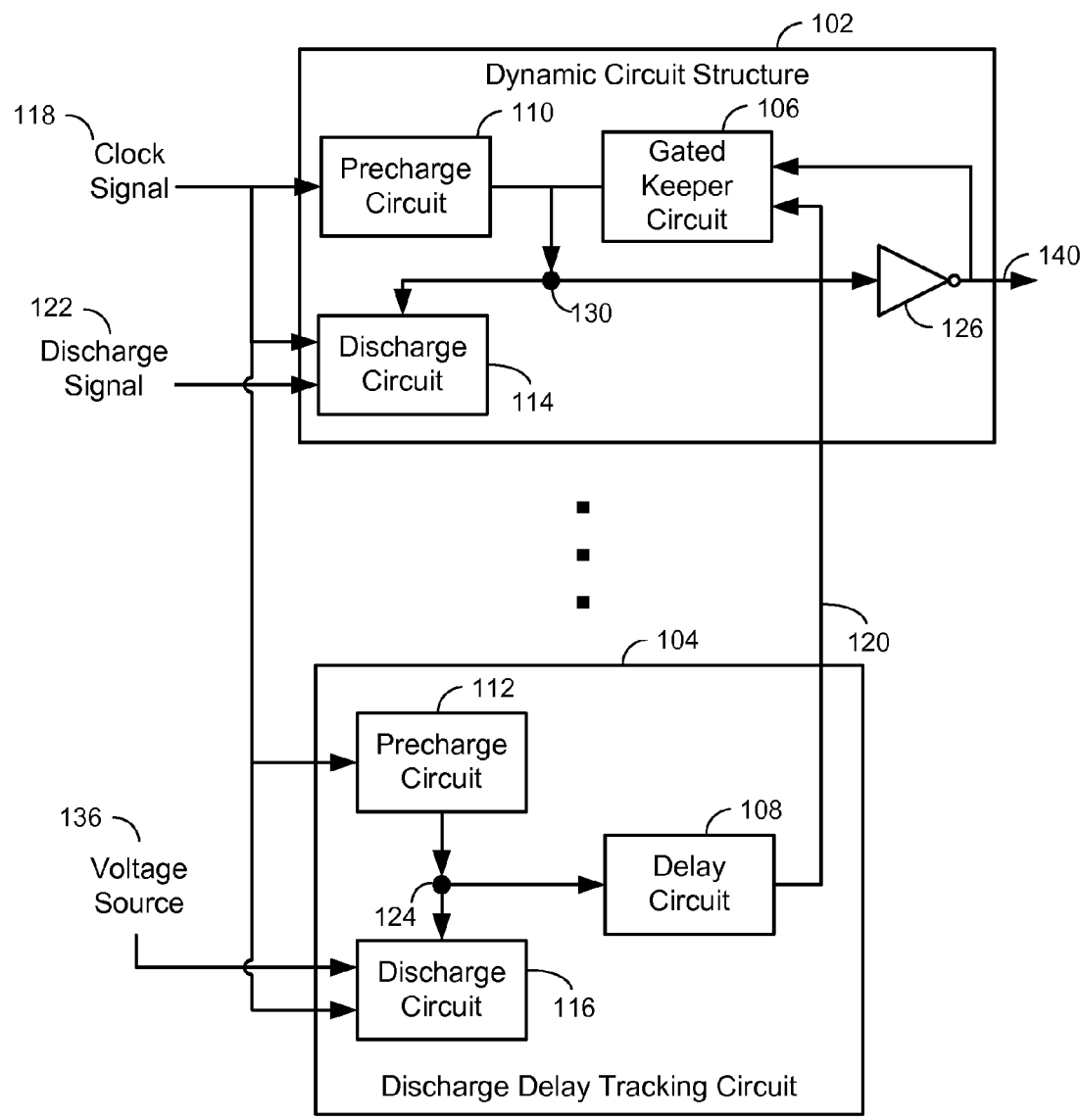
FIG. 1 is a block diagram of a first illustrative embodiment of a system that can be used as a voltage level shifter that tracks a discharge delay of a dynamic node of a dynamic circuit structure.

Referring to FIG. 1, a first embodiment of a system that can be used as a voltage level shifter that tracks a discharge delay of a dynamic node 130 of a dynamic circuit structure 102 is depicted. The system of FIG. 1 includes the dynamic circuit structure 102 and a discharge delay tracking circuit 104. The dynamic circuit structure 102 is responsive to the discharge delay tracking circuit 104 to control charging elements and discharging elements coupled to the internal dynamic node 130.

The dynamic circuit structure 102 receives a clock signal 118 and a discharge signal 122 as inputs and generates an output 140 via an inverter 126 that is coupled to the dynamic node 130. The dynamic circuit structure 102 can operate by receiving the discharge signal 122 from a first voltage domain and providing an output signal 140 to correspond to the discharge signal 122 shifted to a second voltage domain, as will be explained with respect to FIG. 2. The dynamic circuit structure 102 also includes a first precharge circuit 110, a gated keeper circuit 106, and a first discharge circuit 114 that are coupled to the dynamic node 130 to control a voltage level at the dynamic node 130. Although a single dynamic circuit structure 102 is depicted, multiple dynamic circuits/level shifters could share a tracking cell, such as the discharge delay tracking circuit 104, when the structures of the dynamic circuits and the tracking cell are similar, as illustrated in FIG. 3.

The first precharge circuit 110 receives the clock signal 118 as an input and either couples or decouples the dynamic node 130 to a voltage supply in response to the input. The first discharge circuit 114 receives the clock signal 118 and a discharge signal 122 as inputs. The gated keeper circuit 106 receives a feedback signal from the output 140 of the dynamic circuit structure 102 as an input. The gated keeper circuit 106 also receives a discharge delay tracking circuit output 120 from the discharge delay tracking circuit 104 as an input.

The first precharge circuit 110 is configured to set the voltage level at the dynamic node 130 to a particular voltage level in response to the clock signal 118. The first discharge circuit 114 is configured to discharge the dynamic node 130 to a reference voltage level from the particular voltage level. A 'discharge delay' is an amount of time during which a dynamic node is substantially discharged. The gated keeper circuit 106 is configured to maintain the state of the dynamic node 130 during selected time periods of operation of the dynamic circuit structure 102.

The discharge delay tracking circuit 104 includes a second precharge circuit 112, a second discharge circuit 116, and a delay circuit 108 coupled to a dynamic node 124. The second precharge circuit 112 is configured to precharge the node 124 to the particular voltage level in response to the clock signal 118. The second discharge circuit 116 is configured to discharge the node 124 in response to the clock signal 118. The second discharge circuit 116 is also configured to receive a voltage source 136. The voltage source 136 can be a supply voltage level corresponding to a logic "high" voltage level of the discharge signal 122 to enable the discharge delay tracking circuit 104 to exhibit similar discharge characteristics as the dynamic circuit structure 102.

In a particular embodiment, the second discharge circuit 116 of the discharge delay tracking circuit 104 is configured with substantially similar components as the first discharge circuit 114 of the dynamic circuit structure 102. The operational characteristics of the second discharge circuit 116 substantially match the operational characteristics of the first discharge circuit 114. In the example system of FIG. 1, the first discharge circuit 114 and the second discharge circuit 116 are responsive to a common clock (i.e. clock signal 118). The second discharge circuit 116 and the first discharge circuit 114 commence discharging the dynamic node 124 and the dynamic node 130, respectively, at approximately the same time. The second discharge circuit 116 and the first discharge circuit 114 also complete the discharge of the dynamic node 124 and the dynamic node 130, respectively, at approximately the same time. Thus, the discharge delay tracking circuit 104 is configured to mimic the time in discharging the dynamic node 130.

The delay circuit 108 is configured to provide the discharge delay tracking circuit output 120. In a particular embodiment, a logical voltage level provided at the discharge delay tracking circuit output 120 may track a logical voltage level at the node 124. The delay circuit 108 introduces a delay between an occurrence of a state change at the dynamic node 124 and a corresponding change at the discharge delay tracking circuit output 120. In various embodiments, the delay may be generated by the delay circuit 108 in various ways. For example, the delay circuit 108 may be configured to introduce a programmable delay, where an amount of the delay may be set. In another example, the delay circuit 108 may provide a programmable delay to compensate for variations at the dynamic circuit structure 102. Variations that occur at the dynamic circuit structure 102 may include device variations from a manufacturing process, variations of voltage levels, precharge times, discharge times, electrical interference, or other variations as will occur to persons of skill in the art.

The gated keeper circuit 106 is responsive to the discharge delay tracking circuit output 120. The discharge delay tracking circuit output 120 is configured to enable and disable operation of the gated keeper circuit 106. In a particular embodiment, operation of the gated keeper circuit 106 is enabled upon detection of the output signal 120, after a discharge time period during which the dynamic node 124 is substantially discharged.

By enabling the gated keeper circuit 106 based on a discharge of the node 124, and because the node 124 discharges without contention from a keeper circuit, a speed of operation and a range of operating voltages may be improved as compared to conventional voltage shifters. The system of FIG. 1 may be used as a voltage level shifter with the clock signal 118 corresponding to a first voltage domain and the discharge signal 122 corresponding to a second voltage domain, as described in FIGS. 2-3. Signals that are part of a voltage domain may be at a voltage level within a particular range of voltage levels. For example, the first voltage domain may include a range of voltage levels from a ground reference voltage (0 Volts) to Vdd_H and the second voltage domain may include a range of voltage levels from the ground reference voltage to Vdd_L, where Vdd_H is greater than Vdd_L.

In contrast to the system of FIG. 1, in conventional systems that have a node that discharges through an N-channel Field Effect Transistor (NFET) in contention with a P-channel Field Effect Transistor (PFET) keeper, low values of a voltage source applied to the NFET gate may cause a discharge current to be comparable to a keeper current, slowing a speed of operation and setting a lower limit on the voltage source. In such conventional systems, a ratio between the NFET and the PFET may be critical for operation and may cause the conventional voltage shifter to be susceptible to process variations. In conventional systems having a stack keeper responsive to the input signal from a Vdd_L domain, similar issues can be present as a difference between Vdd_H and Vdd_L exceeds a threshold voltage of the stack keeper.

Because the gated keeper circuit 106 is responsive to the delay output 120, early enabling and late enabling of the gated keeper circuit 106 may both be avoided. Early enabling may result in contention between the keeper circuit 106 and the first discharge circuit 114 and may reduce a voltage shifting operating limit and speed. Late enabling may cause a voltage drop on the dynamic node 130 from pull-down leakage. In addition, the circuit of FIG. 1 may enable an improved voltage operation gap between a first voltage domain and a second voltage domain, a reduced or eliminated effect of process variation on a ratio between devices in the discharge circuit and devices in the keeper circuit 106, reduced delay of level shifting, lower supply voltage domain operation range, and reduced power consumption by avoiding a short circuit from the gated keeper circuit 106 through the first discharge circuit 114 during transition.

In a particular embodiment, the clock signal 118 is part of a first voltage domain and the discharge signal 122 is part of a second voltage domain. The first precharge circuit 110 of the dynamic circuit structure 102 may be configured to precharge the dynamic node 130 to Vdd_H and the first discharge circuit 114 may be configured to discharge the dynamic node 130 responsive to receiving the signal 122 at Vdd_L and the clock signal 118 at Vdd_H as a combined discharge signal. The output 140 provided by the dynamic circuit structure 102 when the dynamic node 130 is fully discharged may be at Vdd_H. That is, the dynamic circuit structure 102 may operate as a voltage level shifter that shifts the logic high voltage level of the second voltage domain (Vdd_L) to the logic high voltage level of the first voltage domain (Vdd_H).

Figure 2:
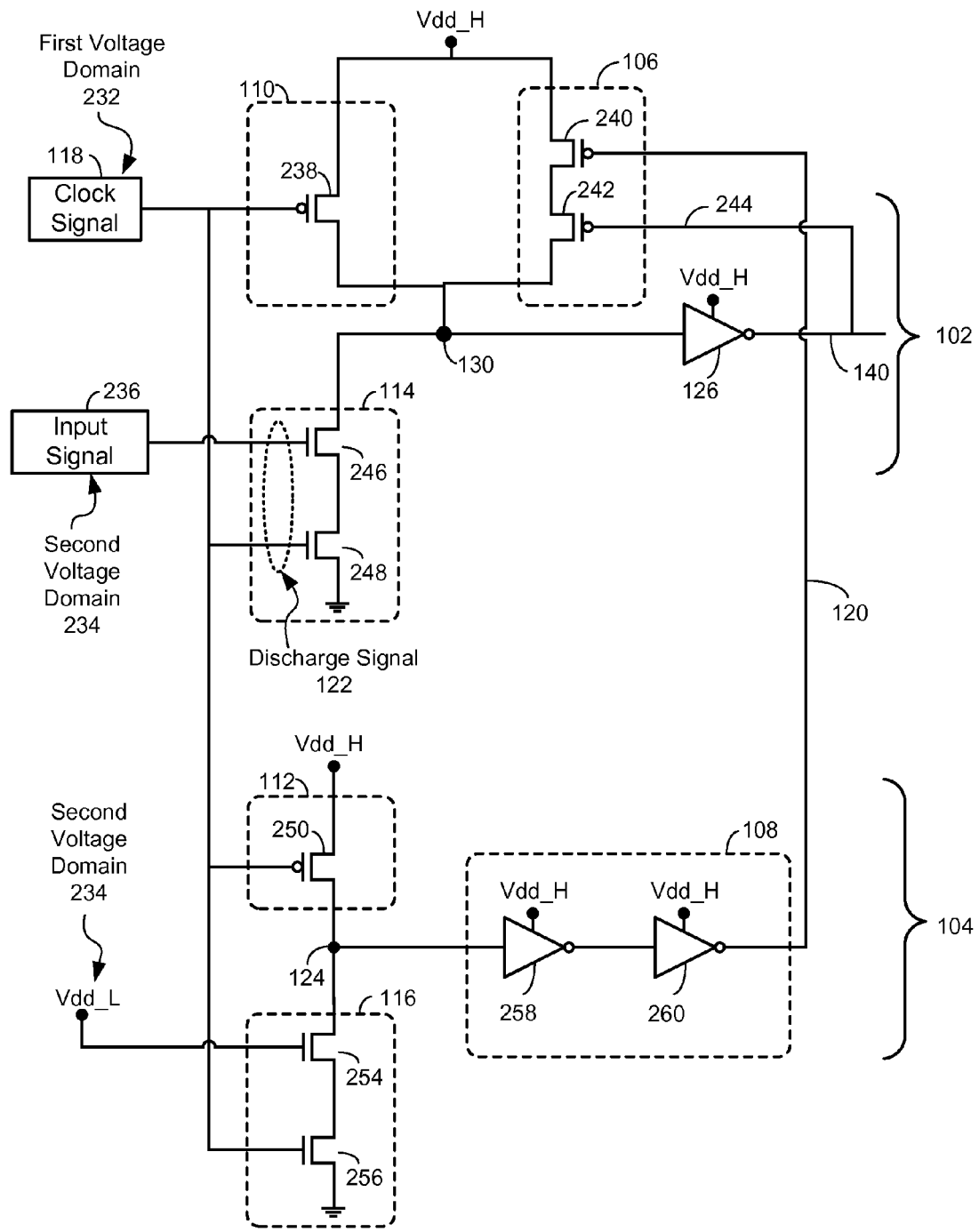
FIG. 2 is a block diagram of a second illustrative embodiment of a voltage level shifting system that tracks a discharge delay of a dynamic node of a dynamic circuit structure.
Figure 3:
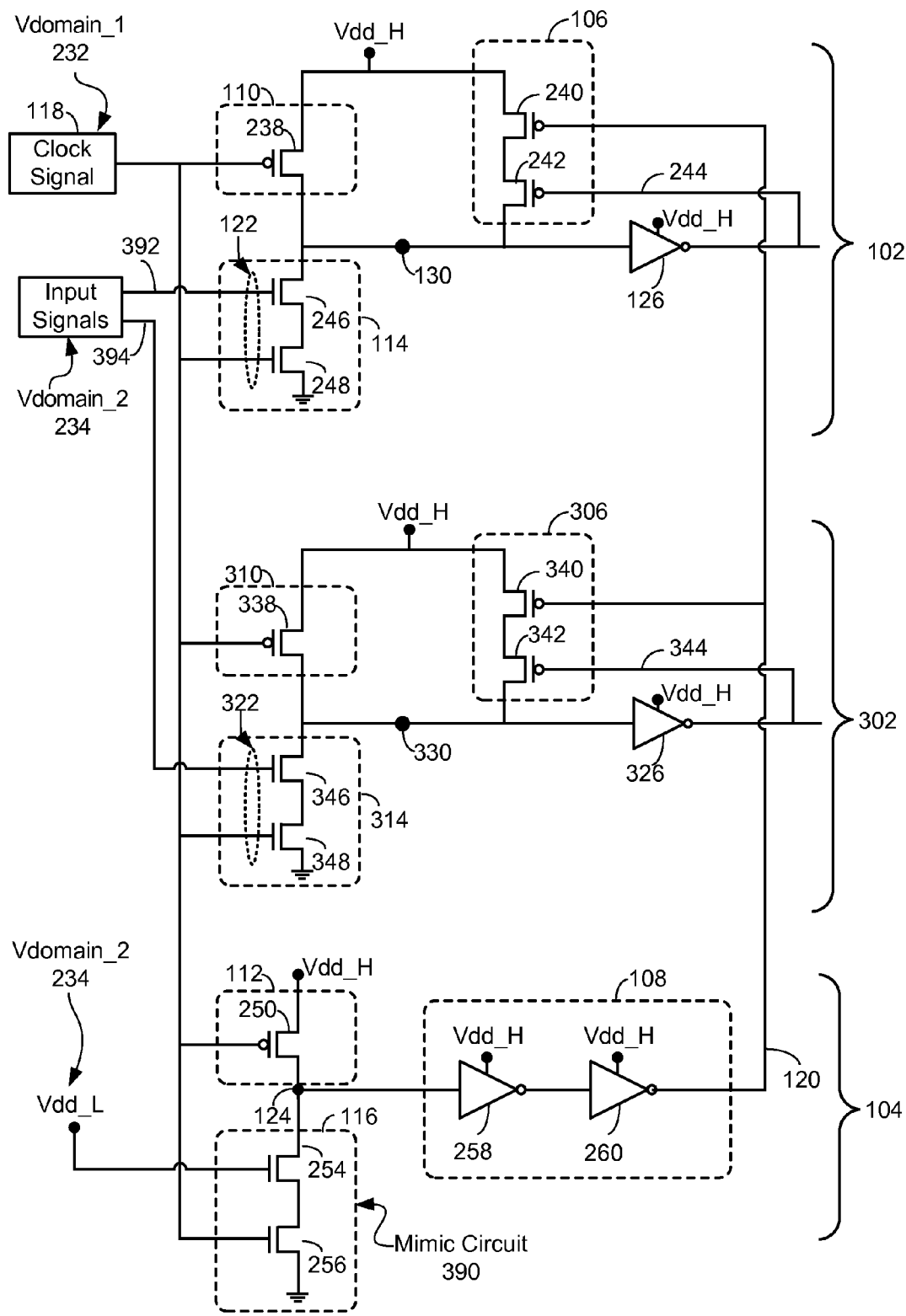
FIG. 3 is a block diagram of a third illustrative embodiment of a voltage level shifting system that tracks a discharge delay of a dynamic node of a dynamic circuit structure.

Referring to FIG. 2, a particular embodiment of the voltage shifter system of FIG. 1 is depicted. The system of FIG. 2 illustrates a particular, non-limiting implementation of various components of the voltage shifter system. The dynamic circuit structure 102 includes the first precharge circuit 110, the first discharge circuit 114, and the gated keeper circuit 106. The dynamic circuit structure 102 receives an input signal 236 at a second voltage domain 234 (e.g., a range of voltages from ground to a supply voltage of Vdd_L) and provides the output 140 corresponding to the input signal 236 shifted to a first voltage domain 232 (e.g., a range of voltages from ground to a supply voltage of Vdd_H).

The first precharge circuit 110 of the dynamic circuit structure 102 includes a precharge transistor 238. In the example system of FIG. 2, the precharge transistor 238 is a P-channel Field Effect Transistor (PFET) shown for clarity of explanation, not of limitation. The precharge transistor 238 will turn on, coupling Vdd_H to the dynamic node 130, when the clock signal 118 is at a logic low voltage level. When the clock signal 118 is at a logic high voltage level, the precharge transistor 238 is off and does not couple Vdd_H to the dynamic node 130.

The first discharge circuit 114 of the dynamic circuit structure 102 includes a first discharge transistor 246 and a second discharge transistor 248. In the example system of FIG. 2, the first discharge transistor 246 is an N-channel FET (NFET) and the second discharge transistor 248 is an NFET for clarity of explanation, not of limitation. The first discharge circuit 114 is configured to discharge the dynamic node 130 from Vdd_H to a reference voltage responsive to the discharge signal 122. The discharge signal 122 in the example of FIG. 2 includes the clock signal 118 and the input signal 236. For example, the first discharge transistor 246 turns on when the clock signal 118 is at a logic high voltage level, the second discharge transistor 248 turns on when the input signal 236 is at a logic high level, and the dynamic node 130 is then coupled to the ground reference voltage via the first and second discharge transistors 246, 248. The dynamic node 130 discharges from Vdd_H to the reference voltage level when coupled to the ground reference voltage via the first and second discharge transistors 246, 248.

The keeper circuit 106 of the dynamic circuit structure 102 includes a first keeper transistor 240 and a second keeper transistor 242. The first and second keeper transistors 240, 242 are serially coupled and their respective locations in the keeper circuit 106 may be swapped in other embodiments. In the example system of FIG. 2, each of the first and second keeper transistors 240, 242 are PFETS for clarity of explanation. The keeper circuit 106 is configured to maintain the voltage level at the dynamic node 130 after the dynamic node 130 is precharged responsive to a feedback signal 244 provided by the output 140 of the dynamic circuit structure 102 and responsive to the discharge delay tracking circuit output 120. For example, the second keeper transistor 242 is on when the output 140 of dynamic circuit structure 102 is at a logic low voltage level and the first keeper transistor 240 is on when the discharge delay tracking circuit output 120 is at a logic low voltage level. When the first and second keeper transistors 240, 242 are both on, the dynamic node 130 is coupled to Vdd_H via the transistors 240, 242. In this state, the gated keeper 106 is enabled and maintains the voltage level of the dynamic node 130.

The second precharge circuit 112 of the discharge delay tracking circuit 104 includes a precharge transistor 250. In the example system of FIG. 2, the precharge transistor 250 is a PFET. The second precharge circuit 112 is configured to precharge the node 124 to Vdd_H responsive to the clock signal 118. For example, the precharge transistor 250 turns on and couples Vdd_H to the node 124 when the clock signal 118 as at a logic low voltage level.

The second discharge circuit 116 of the discharge delay tracking circuit 104 includes a first discharge transistor 254 and a second discharge transistor 256. The first and second discharge transistors 254, 256 are NFETS for clarity of explanation. The first discharge transistor 254 has a gate coupled to a low voltage source, Vdd_L. The second discharge transistor 256 receives an input from the clock signal 118. The second discharge circuit 116 is configured to discharge the node 124 from Vdd_H to the ground reference voltage. For example, when the clock signal 118 is at a logic high level of the first voltage domain 232 (e.g., equal to Vdd_H), the second discharge transistor 256 and the first discharge transistor 254, respectively, are on and the node 124 is coupled to the ground reference voltage, and the node 124 discharges from Vdd_H to the ground reference voltage via the first and second discharge transistors 254, 256.

In a particular embodiment, the second discharge circuit 116 of the discharge delay tracking circuit 104 effectively mimics or estimates the delay in discharging the dynamic node 130 of the dynamic circuit structure 102 by the first discharge circuit 114 of the dynamic circuit structure 102. The second discharge circuit 116 includes substantially similar components as the first discharge circuit 114, such as a stacked pair of NFETS. Further, the second discharge circuit 116 is responsive to the same clock signal as the first discharge circuit 114, the clock signal 118, and also corresponds to the same voltage shifting combination of Vdd_H and Vdd_L. Having substantially similar components and being responsive to the same signal, the second discharge circuit 116 of the discharge delay tracking circuit 104 discharges the node 124 with a similar discharging time as the dynamic node 130 of the dynamic circuit structure 102. That is, the delay in discharging the node 124 of the discharge delay tracking circuit 104 matches, or approximately matches, the delay in discharging the dynamic node 130 of the dynamic circuit structure 102. In this way, the discharge delay tracking circuit 104 is said to "track" or estimate the time in discharging the dynamic node 130. In addition, the voltage shifter system of FIG. 2 may be implemented is systems with different values of Vdd_H and Vdd_L, that would result in different discharge times of the dynamic circuit structure 102. Because the discharge delay tracking circuit 104 has a similar circuit structure and operates based on the same Vdd_H and Vdd_L combination as the dynamic circuit structure 102, the discharge delay tracking circuit 104 is operative to closely mimic or track a discharge time of the dynamic circuit structure 102.

In a particular embodiment, the delay circuit 108 of the discharge delay tracking circuit 104 provides an adjustable delay to the discharge delay tracking circuit output 120 and provides a correct logic polarity to control an operation of the keeper circuit 106 via the first keeper transistor 240. The delay circuit 108 in the example of FIG. 2 includes two inverters 258, 260. Each of the inverters 258, 260, introduces a delay applied to the output of the node 124 to generate the discharge delay tracking circuit output 120, which is generated in the second voltage domain 234. In a particular embodiment, the delay circuit 108 includes a programmable delay. For example, the delay circuit 108 may include a programmable inverter circuit in which the delay introduced by the delay circuit 108 is managed by adjusting the number of inverters coupling the input of the programmable inverter circuit to the discharge delay tracking circuit output 120.

In the system of FIG. 2, the discharge delay tracking circuit 104 is configured to selectively enable the keeper transistor 240 via the discharge delay tracking circuit output 120 after the first discharge circuit 114 of the dynamic circuit structure 102 discharges the dynamic node 130 since the discharge time of node 124 is similar to the discharge time of node 130. That is, the gated keeper circuit 106 of the dynamic circuit structure 102 is not enabled until after the dynamic node 130 is discharged. In this way, there is reduced or no contention between the gated keeper circuit 106 and the first discharge circuit 114 of the dynamic circuit structure 102 during discharge of the dynamic node 130.

The example dynamic circuit structure 102 and discharge delay tracking circuit 104 of FIG. 2 may be utilized in a variety of implementations. In a particular embodiment, the example dynamic circuit structure 102 and the delay tracking circuit 104 may be used with a wordline of a register file or a memory. In another particular embodiment, the dynamic circuit structure 102 and the delay tracking circuit 104 may be part of a read or write column multiplexer. In another particular embodiment, the dynamic circuit structure 102 and the delay tracking circuit 104 may be part of a read or write wordline driver in a memory circuit. In another particular embodiment, the dynamic circuit structure 102 and the delay tracking circuit 104 may be part of a multiplier select circuit to perform a multiplier select function.

Referring to FIG. 3, an embodiment of the voltage level shifting system of FIG. 1 that tracks discharge delays of dynamic nodes 130, 330 of a number of dynamic circuit structures 102, 302 is depicted. The voltage level shifting system of FIG. 3 includes two representative dynamic circuit structures 102, 302 and the single discharge delay tracking circuit 104 to convert signals from the second voltage domain Vdomain_2 234 to the first voltage domain Vdomain_1 232. Each dynamic circuit structure 102, 302 is responsive to a corresponding input signal 392, 394 from the second voltage domain 234 and to the clock signal 118 from the first voltage domain 232. Although only two dynamic circuit structures 102, 302 are depicted, multiple dynamic circuits/level shifters could share a tracking cell, such as the discharge delay tracking circuit 104, when the structures of the dynamic circuits and the tracking cell are similar.

The dynamic circuit structure 302 of FIG. 3 is similar to the dynamic circuit structure 102 of FIG. 2. For example, the dynamic circuit structure 302 includes a precharge circuit 310, a discharge circuit 314, and a gated keeper circuit 306, where the precharge circuit 310, the discharge circuit 314, and the gated keeper circuit 306 are coupled at a dynamic node 330 that provides an input to an inverter 326. The inverter 326 provides an output of the dynamic circuit structure 302. The discharge circuit 314 of the dynamic circuit structure 302 is responsive to the second input signal 394 and to the clock signal 118. The components of the dynamic circuit structure 302 of FIG. 3 operate as described above with respect to the corresponding components of the dynamic circuit structure 102 of FIG. 2.

The discharge delay tracking circuit 104 provides the delay tracking circuit output 120 to multiple dynamic circuit structures 102, 302. In the example system of FIG. 3, the second discharge circuit 116 of the discharge delay tracking circuit 104 is a mimic circuit 390. A mimic circuit mimics the operation of another circuit. In the example of FIG. 3, the mimic circuit 390 mimics the operation of the discharge circuits 114, 314 of the dynamic circuit structures 102, 302.

Figure 4:
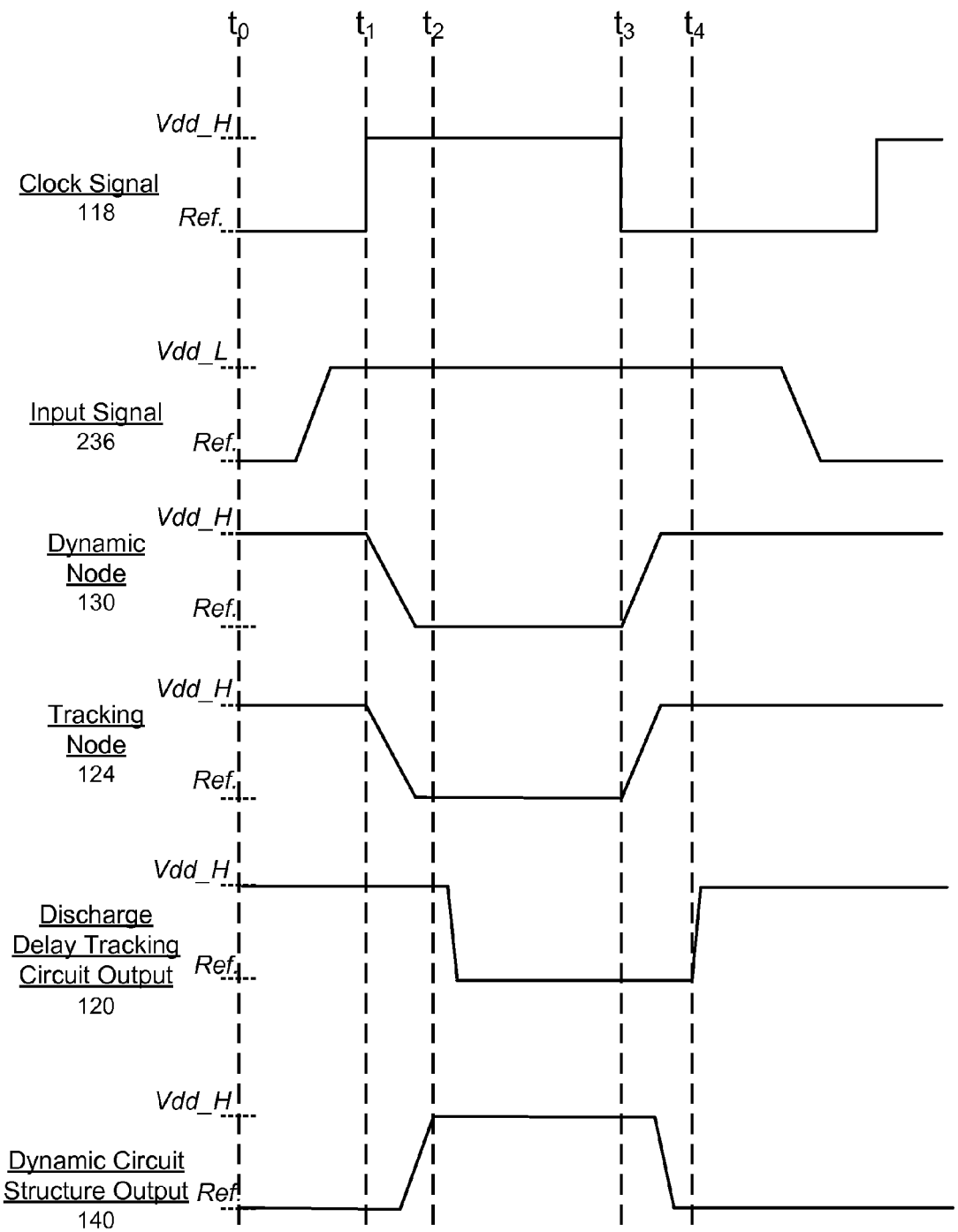
FIG. 4 is an illustration of a particular embodiment of a timing diagram generated by the system of FIG. 2.

Referring to FIG. 4, an illustration of a particular embodiment of a timing diagram generated by the system of FIG. 2 is depicted. The timing diagram of FIG. 4 describes operation of the clock signal 118 of FIG. 2, the input signal 236 of FIG. 2, voltage at the dynamic node 130 of FIG. 2, voltage at the tracking circuit node 124 of FIG. 2, the discharge delay tracking circuit output 120 of FIG. 2, and the dynamic circuit structure output 140 of FIG. 2. The timing diagram of FIG. 4 is described below with respect to the signals, nodes, circuits, and other components of the system of FIG. 2.

Between t0 and t1 of the timing diagram of FIG. 4, the clock signal 118 is at a logic low voltage level. Responsive to the clock signal 118, the first precharge circuit 110 of the dynamic circuit structure 102 of FIG. 2 couples Vdd_H to the dynamic node 130, precharging the dynamic node 130 to Vdd_H. Responsive to the dynamic node 130 precharged to Vdd_H, the dynamic circuit structure output 140 is at a reference voltage.

Also responsive to the clock signal 118 between t0 and t1, the second precharge circuit 112 of the discharge delay tracking circuit 104 couples the node 124 to Vdd_H. Responsive to the precharging of the node 124 to Vdd_H, the discharge delay tracking circuit output 120 is at Vdd_H.

Between t1 and t2 of the timing diagram of FIG. 4, the input signal 236 is at Vdd_L, having transitioned from the reference voltage to Vdd_L between t0 and t1. Between t1 and t2, the clock signal 118 is at Vdd_H. Responsive to the clock signal 118, the first precharge circuit 110 decouples the dynamic node 130 from Vdd_H. Responsive to the clock signal 118 and the input signal 236 being high during the period from t1 to t2, the first discharge circuit 114 discharges the dynamic node 130 from Vdd_H to the reference voltage. Responsive to the discharge of the dynamic node 130 from Vdd_H to the reference voltage, the dynamic circuit structure output 140 transitions from the reference voltage to Vdd_H.

Responsive to the clock signal 118 between t1 and t2, the second discharge circuit 116 of the discharge delay tracking circuit 104 discharges the node 124 from Vdd_H to the reference voltage. No corresponding change occurs to the discharge delay tracking circuit output 120, due to the delay circuit 108 which delays the transition of the discharge delay tracking circuit from Vdd_H to the reference voltage. As such, between t1 and t2 of the timing diagram of FIG. 4, the discharge delay tracking circuit output 120 remains at Vdd_H.

The gated keeper circuit 106 of the dynamic circuit structure 102 is not enabled between t1 and t2 because the discharge delay tracking circuit output 120 remains at Vdd_H. Between t1 and t2, therefore, there is no contention between the gated keeper circuit 106 and the first discharge circuit 114 of the dynamic circuit structure 102 during the discharge of the dynamic node 130.

Between t2 and t3 of the timing diagram of FIG. 4, the clock signal 118 and the input signal 236 remain at a high value, maintaining the dynamic node 130 at the reference voltage and the dynamic circuit structure output 140 at Vdd_H. The discharge delay tracking circuit output 120 transitions from Vdd_H to the reference voltage, enabling the first keeper transistor 240 of the gated keeper circuit 108. The second keeper transistor 242 is not enabled, responsive to the feedback signal 244 from the dynamic circuit structure output, which remains at Vdd_H.

Between t3 and t4 of the timing diagram of FIG. 4, the clock signal 118 is at the reference voltage. Responsive to the change in the clock signal 118, the first precharge circuit 110 of the dynamic circuit structure 102 couples Vdd_H to the dynamic node 130, precharging the dynamic node 130 to Vdd_H. The dynamic circuit structure output 140 transitions from Vdd_H to the reference voltage responsive to the precharging of the dynamic node 130 to Vdd_H.

Also responsive to the clock signal 118 between t3 and t4, the second precharge circuit 112 of the discharge delay tracking circuit 104 couples the node 124 to Vdd_H. Due to the delay provided by the delay circuit 108, the discharge delay tracking circuit output 120 remains at the reference voltage between t3 and t4. After the delay provided by the delay circuit 108, at time t4 the delay tracking output circuit 120 transitions to a logic high level (e.g. Vdd_H) and thus disables the keeper transistor 240 based on the transition of the node 124.

Between t3 and t4, when the dynamic circuit structure output 140 is at the reference voltage and the discharge delay tracking circuit output 120 is also at the reference voltage, the first and second keeper transistors 240, 242 are enabled and the gated keeper circuit 106 couples the dynamic node 130 to Vdd_H until the transition at the tracking node 124 propagates through the delay circuit 108 and disables the keeper transistor 240. In a multiple dynamic circuit structure system, such as that depicted in the example of FIG. 3, the gated keeper circuit of any dynamic circuit structure not receiving an input signal at Vdd_L is enabled when the discharge delay tracking circuit output 120 is at the reference voltage. For example, when the dynamic circuit structure 102 of FIG. 3 receives the first input signal 392 at Vdd_L and the clock signal 118 is at the reference voltage, there is no contention between the gated keeper circuit 106 and the first discharge circuit 114 during discharge of the dynamic node 130. Further, when the second input signal 394 is not at Vdd_L, the gated keeper circuit 306 of the dynamic circuit structure 302 is enabled and maintains the voltage level at the dynamic node 330 to Vdd_H. When the time is greater than t4, the input signal 236 is returned to the reference value and the discharge delay tracking circuit output 120 returns to Vdd_H.

Figure 5:
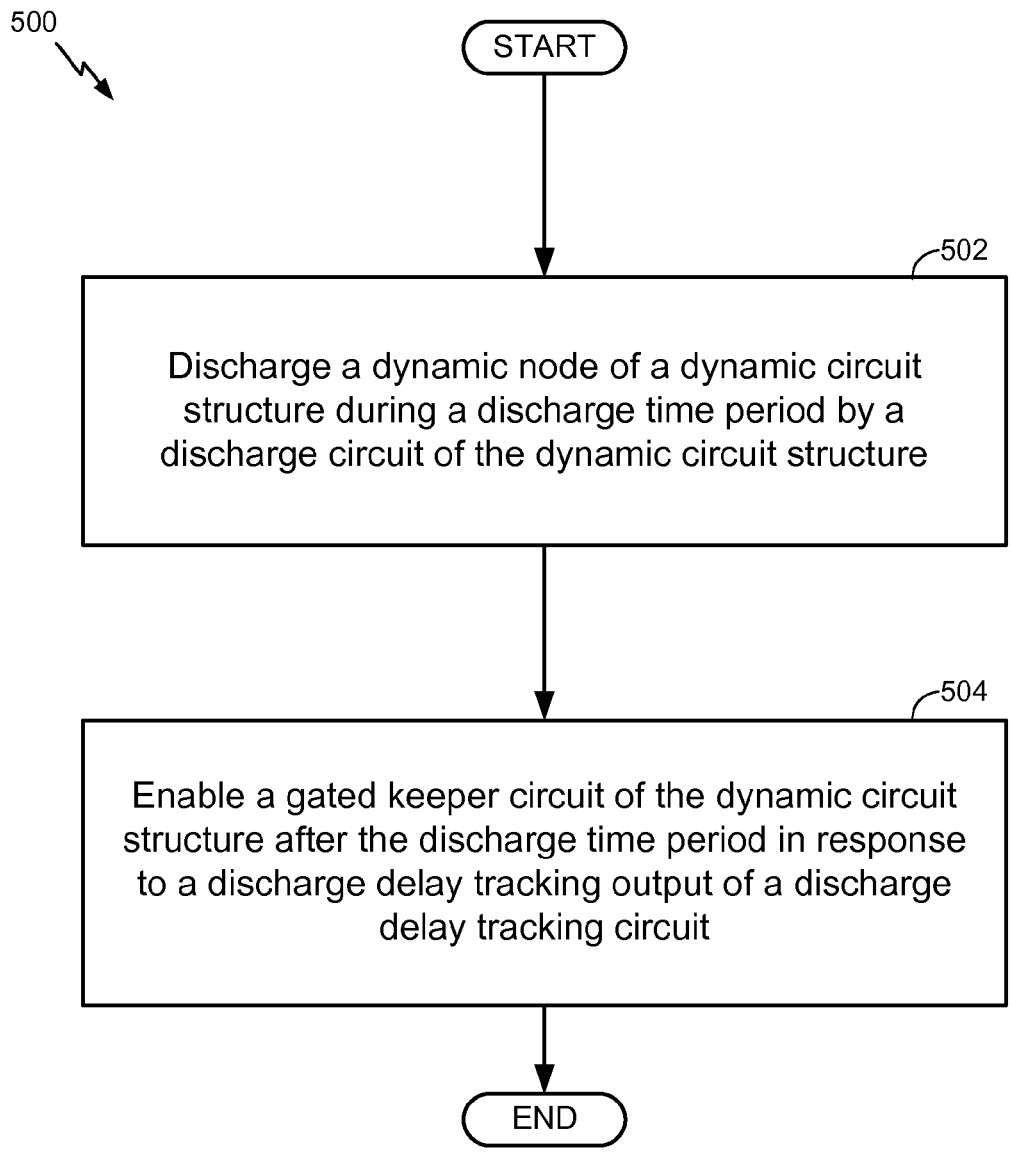
FIG. 5 is a flow diagram of a first illustrative embodiment of a method of operating a dynamic circuit structure with discharge delay tracking.

Referring to FIG. 5, a flow diagram is depicted of a first embodiment of a method of operating a dynamic circuit structure. The method 500 includes discharging a dynamic node of a dynamic circuit structure during a discharge time period by a discharge circuit of the dynamic circuit structure, at 502. For example, the first discharge circuit 114 of the dynamic circuit structure 102 of the system of FIG. 2 may discharge the dynamic node 130 responsive to receiving the clock signal 118 at Vdd_H and receiving the input signal 236 at Vdd_L.

The method 500 of FIG. 5 also includes enabling operation of a gated keeper circuit of the dynamic circuit structure after the discharge time period in response to a discharge delay tracking output of a discharge delay tracking circuit, at 504. For example, the discharge delay tracking circuit 104 of the system of FIG. 2 may provide the discharge delay tracking circuit output 120 to enable the second keeper transistor 242 of the gated keeper circuit 106. For example, the second discharge circuit 116 of the discharge delay tracking circuit 104 of the system of FIG. 2 may discharge the node 124 responsive to receiving the clock signal 118 at the reference voltage. The delay circuit 108 of the discharge delay tracking circuit 104 may delay the transition of the discharge delay tracking circuit output 120. Thus, the gated keeper is controlled by the discharge delay tracking circuit to enable the gated keeper at a time after discharge of a dynamic node to improve performance.

Figure 6:
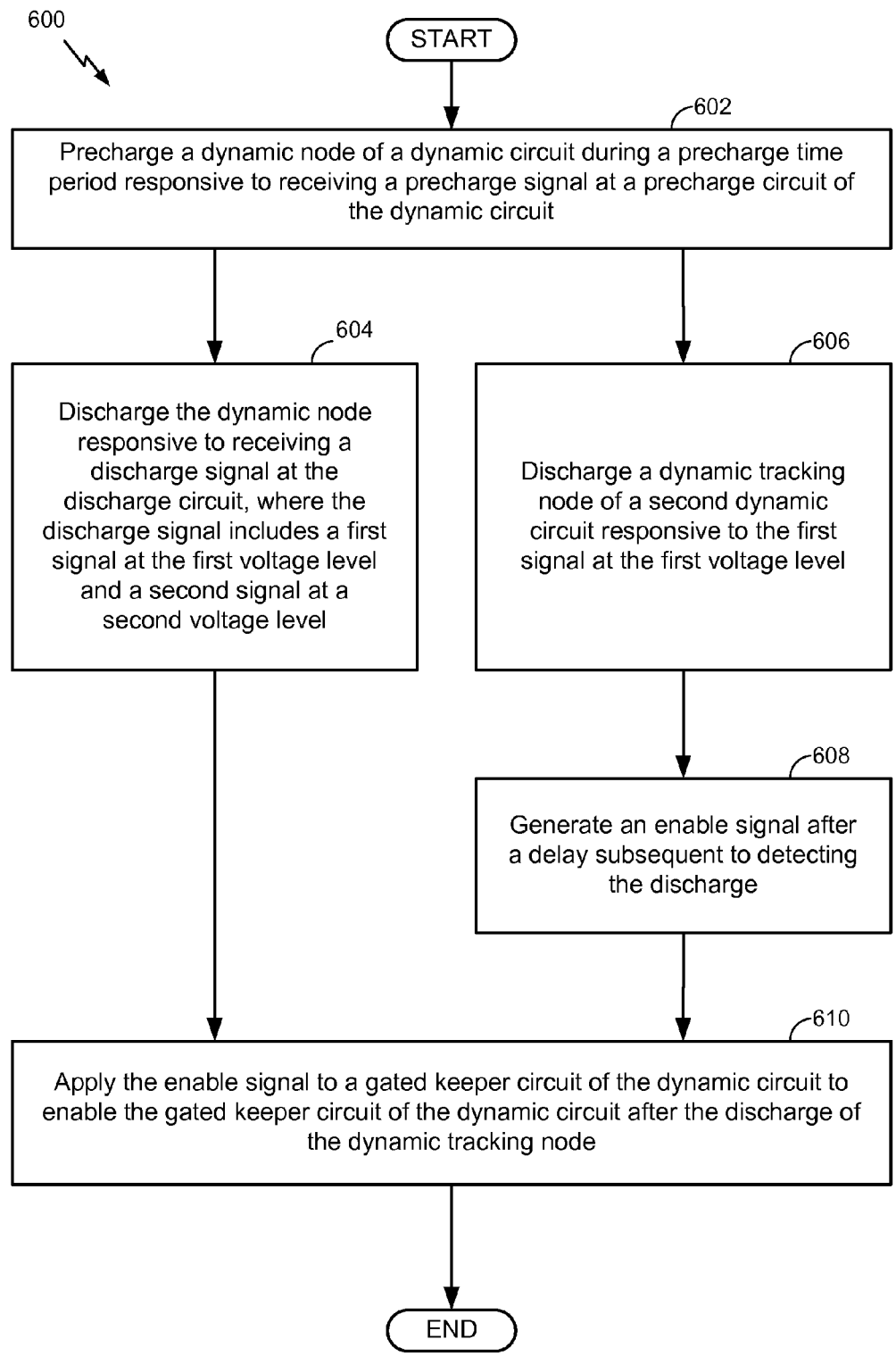
FIG. 6 is a flow diagram of a second illustrative embodiment of a method of operating a dynamic circuit structure with discharge delay tracking.

Referring to FIG. 6, a method of controlling timing of a dynamic circuit is depicted and generally designated 600. A dynamic node of the dynamic circuit may be precharged during a precharge time period responsive to receiving a precharge signal at a precharge circuit of the dynamic circuit, at 602. To illustrate, the dynamic node 130 of FIG. 2 may be precharged during a precharge time period in response to a transition or a voltage level of the clock signal 118. The dynamic node may be precharged to a first voltage level, such as the Vdd_H voltage level of FIG. 2.

The dynamic node may be discharged responsive to receiving a discharge signal at the discharge circuit, where the discharge signal includes a first signal at the first voltage level and a second signal at a second voltage level, at 604. To illustrate, the dynamic node 130 may be discharged in response to the discharge signal 122 of FIG. 2. The discharge signal 122 may include the clock 118 of the first voltage domain 232 and the input signal 236 of the second voltage domain 234.

A dynamic tracking node of a second dynamic circuit is also discharged responsive to the first signal, at 606. For example, the dynamic tracking node may be the node 124 of the discharge delay tracking circuit 104 that shares a common clock with the dynamic circuit structure 102. The clock signal 118 may control precharging of the dynamic node 130 as well as precharging of the node 124. The clock signal 118 may also trigger discharging of the node 124.

An enable signal may be generated after a delay subsequent to detecting the discharge of the dynamic tracking node, at 608. For example, a discharge of the node 124 of FIG. 2 may be detected at the delay circuit 108. To illustrate, a discharge of the node 124 may cause an output of the inverter 258 to change from a logic "0" value to a logic "1" value. The delay may be programmable. For example, the delay amount may be controlled via a programmable inverter circuit. To illustrate, the delay circuit 108 of FIG. 2 may delay the signal received from the node 124 by an amount controlled by an adjustable number of inverters 258, 260 to generate the signal 120.

The enable signal is applied to a gated keeper circuit of the dynamic circuit to enable the gated keeper circuit of the dynamic circuit after the discharge of the dynamic tracking node of the second dynamic circuit, at 610. For example, the signal 120 of FIG. 2 is applied to the keeper circuit 106 to enable operation of the keeper circuit 106 after an evaluation period. As a result, contention between the first discharge circuit 114 and the keeper circuit 106 may be reduced or eliminated in a manner that is substantially tolerant of process and temperature variations.

Generating the enable signal and applying the enable signal to a gated keeper circuit of the dynamic circuit may be performed at a processor integrated into an electronic device. For example, as will be described with respect to FIG. 8, the delayed signal may be generated at a processor core of a portable communication device or other electronic device. Alternatively, or in addition, one of skill in the art will recognize that the method 500 of FIG. 5, the method 600 of FIG. 6, or any combination thereof, could be implemented by a field programmable gate array (FPGA), an application-specific integrated circuit (ASIC), a central processing unit (CPU), a digital signal processor (DSP), a controller, another hardware device, firmware device, or any combination thereof.

Persons of skill in the art will recognize that all or part of the systems of FIGS. 1-3, the methods of FIGS. 5-6, or any combination thereof, may be implemented in an electronic device, such as a processor, part of a memory circuit, or part of another circuit that is integrated into one or more electronic devices. For example, in the method 500 of FIG. 5, discharging of the dynamic node and enabling operation of the gated keeper circuit may be performed at a processor integrated into an electronic device or with other circuits within an electronic device. That is, the dynamic circuit structure and the discharge delay tracking circuit may be integrated into an electronic device. Such an electronic device, for example, may be selected from a group of a set top box, a music player, a video player, an entertainment unit, a navigation device, a communications device, a personal digital assistant (PDA), a fixed location data unit, and a computer. As another illustrative, non-limiting example, the one or more electronic devices may be remote units such as mobile phones, hand-held personal communication systems (PCS) units, portable data units such as personal data assistants (PDA), global positioning system (GPS) enabled devices, navigation devices, fixed location data units such as meter reading equipment, any other device, or any combination thereof. Examples of electronic devices including systems according to the present disclosure are illustrated in FIG. 7 and FIG. 8.

Figure 7:
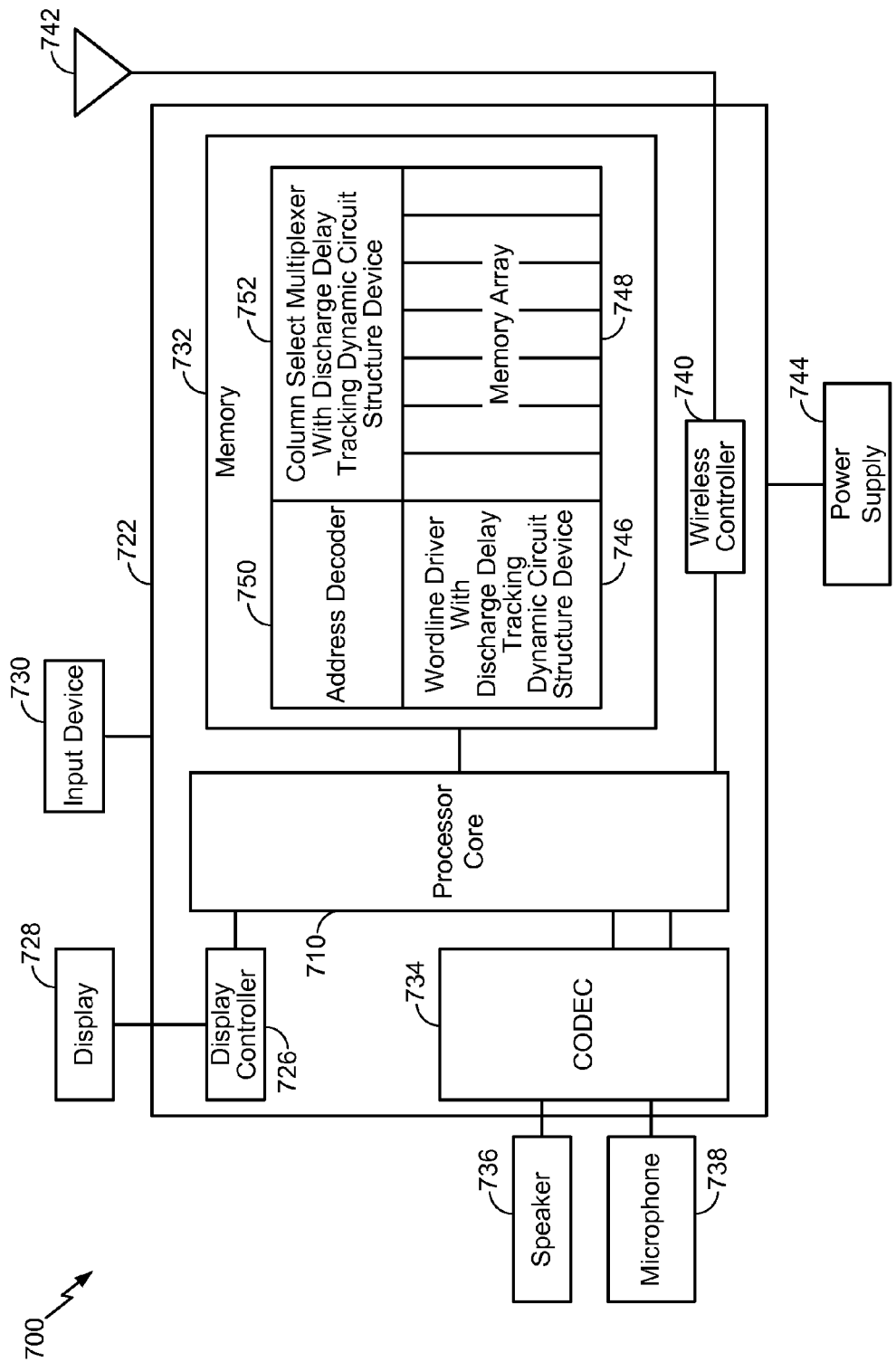
FIG. 7 is a block diagram of a first particular embodiment of a system that includes a discharge delay tracking dynamic circuit structure device.
Figure 8:
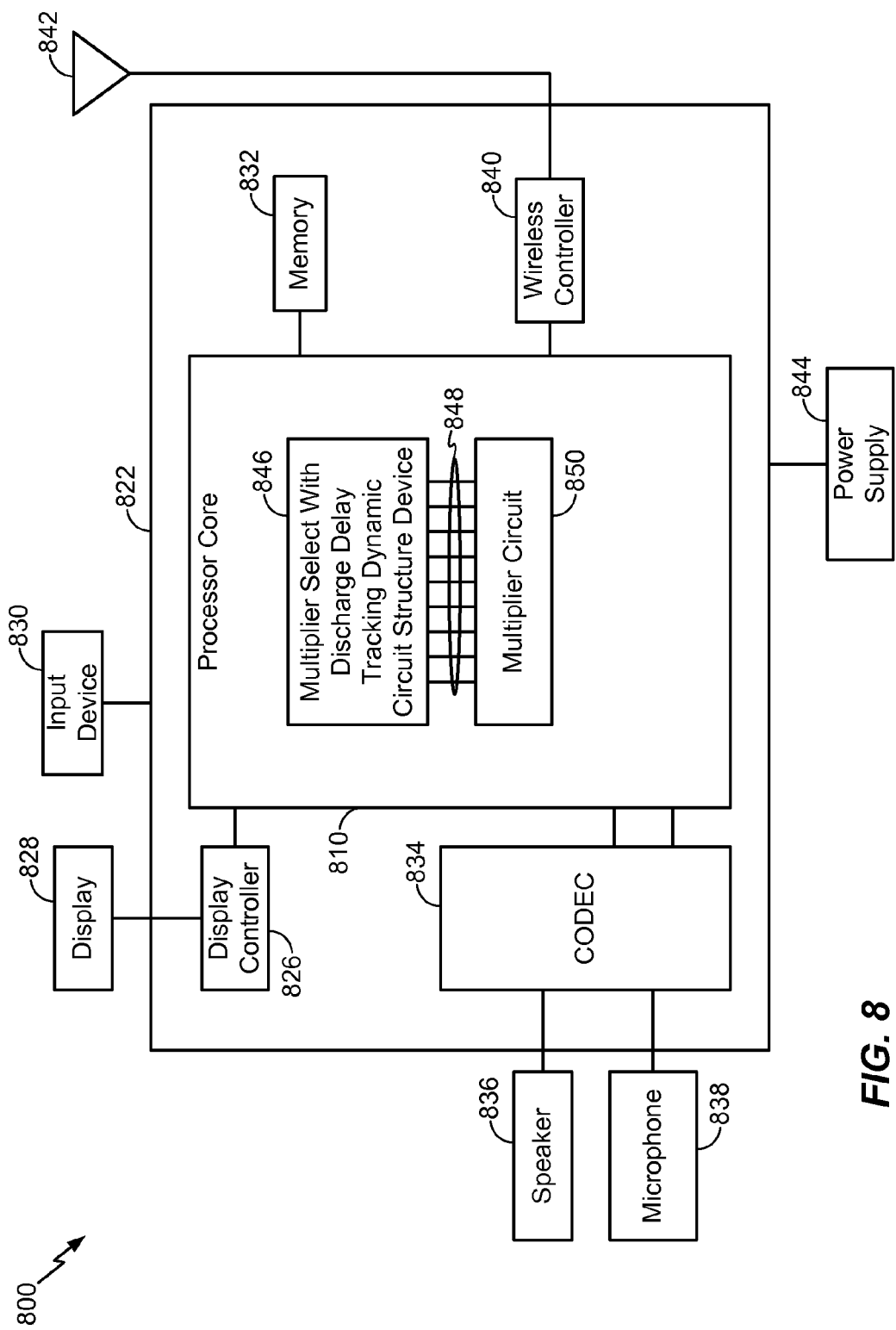
FIG. 8 is a block diagram of a second particular embodiment of a system that includes a discharge delay tracking dynamic circuit structure device.

FIG. 7 is a block diagram of a first particular embodiment of a system 700 that includes two discharge delay tracking dynamic circuit structure devices 746, 752. The system 700 may be implemented in a wireless electronic device and includes a processor core 710, such as one or more general purpose processors or digital signal processors (DSP), coupled to a computer readable medium, such as a memory 732, storing computer readable instructions and data. The memory 732 includes a memory array 748, an address decoder 750, and two dynamic driver circuits: a column select multiplexer circuit 752 and a wordline driver circuit 746. Each of the column select multiplexer circuit 752 and the wordline driver circuit 746 includes a dynamic circuit structure device similar to those depicted in FIGS. 1-3. Each dynamic circuit structure device includes a dynamic circuit structure and a discharge delay tracking circuit. The dynamic circuit structure includes a dynamic node coupling a precharge circuit, a discharge circuit, and a gated keeper circuit. The discharge delay tracking circuit is configured to mimic or estimate a time of discharging the dynamic node by the discharge circuit and is configured to provide an enable signal that is generated after a delay subsequent to a discharge of a dynamic tracking node of the discharge delay tracking circuit. The gated keeper circuit of the dynamic circuit structure is responsive to the enable signal.

The system 700 also includes a display controller 726 coupled to the processor core 710 and to a display device 728. A coder/decoder (CODEC) 734 can also be coupled to the processor core 710. A speaker 736 and a microphone 738 can be coupled to the CODEC 734. A wireless controller 740 can be coupled to the processor core 710 and to a wireless antenna 742.

In a particular embodiment, the processor core 710, the display controller 726, the memory 732, the CODEC 734, and the wireless interface 740 are included in a system-in-package or system-on-chip device 722. In a particular embodiment, an input device 730 and a power supply 744 are coupled to the system-on-chip device 722. Moreover, in a particular embodiment, as illustrated in FIG. 7, the display device 728, the input device 730, the speaker 736, the microphone 738, the wireless antenna 742, and the power supply 744 are external to the system-on-chip device 722. However, each of the display device 728, the input device 730, the speaker 736, the microphone 738, the wireless antenna 742, and the power supply 744 can be coupled to a component of the system-on-chip device 722, such as an interface or a controller of the device 722.

In another particular embodiment, the system 700 of FIG. 7 may be integrated into one or more electronic devices. As an illustrative, non-limiting example, the one or more electronic devices may be selected from the group of a set top box, a music player, a video player, an entertainment unit, a navigation device, a communications device, a personal digital assistant (PDA), a fixed location data unit, and a computer. As another illustrative, non-limiting example, the one or more electronic devices may be remote units such as mobile phones, hand-held personal communication systems (PCS) units, portable data units such as personal data assistants (PDA), global positioning system (GPS) enabled devices, navigation devices, fixed location data units such as meter reading equipment, any other electronic device, or any combination thereof. The disclosure is not limited to these exemplary units. Embodiments of the disclosure may be suitably employed in any device that includes active integrated circuits including memory and circuitry.

FIG. 8 is a block diagram of a particular embodiment of a system 800 that includes at least one dynamic circuit structure device. The system 800 may be implemented in a wireless electronic device and includes a processor core 810, such as one or more general purpose processors or digital signal processors (DSP), coupled to a computer readable medium, such as a memory 832, storing computer readable instructions and data. The processor core 810 of the system 800 of FIG. 8 includes a multiplier select circuit 846 and a multiplier circuit 850. Coupling the multiplier select circuit 846 and the multiplier circuit 850 are a number of multiplier select lines 848. The multiplier select circuit 846 is configured with a discharge delay tracking dynamic circuit structure device similar to the devices depicted in FIGS. 1-3. The dynamic circuit structure device includes a dynamic circuit structure and a discharge delay tracking circuit. The dynamic circuit structure includes a dynamic node coupling a precharge circuit, a discharge circuit, and a gated keeper circuit. The discharge delay tracking circuit is configured to estimate a delay of discharging the dynamic node by the discharge circuit and is configured to provide an enable signal that is generated after a delay subsequent to a discharge of a dynamic tracking node of the discharge delay tracking circuit. The gated keeper circuit of the dynamic circuit structure is responsive to the enable signal.

The system 800 also includes a display controller 826 coupled to the processor core 810 and to a display device 828. A coder/decoder (CODEC) 834 can also be coupled to the processor core 810. A speaker 836 and a microphone 838 can be coupled to the CODEC 834. A wireless controller 840 can be coupled to the processor core 810 and to a wireless antenna 842.

In a particular embodiment, the processor core 810, the display controller 826, the memory 832, the CODEC 834, and the wireless interface 840 are included in a system-in-package or system-on-chip device 822. In a particular embodiment, an input device 830 and a power supply 844 are coupled to the system-on-chip device 822. Moreover, in a particular embodiment, as illustrated in FIG. 8, the display device 828, the input device 830, the speaker 836, the microphone 838, the wireless antenna 842, and the power supply 844 are external to the system-on-chip device 822. Each of the display device 828, the input device 830, the speaker 836, the microphone 838, the wireless antenna 842, and the power supply 844 can be coupled to a component of the system-on-chip device 822, such as an interface or a controller.

In another particular embodiment the system 800 of FIG. 8 may be integrated into one or more electronic devices. As an illustrative, non-limiting example, the one or more electronic devices may be selected from the group of a set top box, a music player, a video player, an entertainment unit, a navigation device, a communications device, a personal digital assistant (PDA), a fixed location data unit, and a computer. As another illustrative, non-limiting example, the one or more electronic devices may be remote units such as mobile phones, hand-held personal communication systems (PCS) units, portable data units such as personal data assistants (PDA), global positioning system (GPS) enabled devices, navigation devices, fixed location data units such as meter reading equipment, any other device, or any combination thereof. The disclosure is not limited to these exemplary units. Embodiments of the disclosure may be suitably employed in any device that includes active integrated circuits including memory and circuitry.

Those of skill would further appreciate that the various illustrative logical blocks, configurations, modules, circuits, and method steps described in connection with the embodiments disclosed herein may be implemented as electronic hardware, computer software executed by a processing unit, or combinations of both. Various illustrative components, blocks, configurations, modules, circuits, and steps have been described above generally in terms of their functionality. Whether such functionality is implemented as hardware or executable processing instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), a magnetoresistive random access memory (MRAM), a spin-torque-transfer magnetoresistive random access memory (STT-MRAM), flash memory, read-only memory (ROM), programmable read-only memory (PROM), erasable programmable read-only memory (EPROM), electrically erasable programmable read-only memory (EEPROM), registers, a hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A voltage level shifter comprising:
   a dynamic circuit structure configured to receive an input signal from a first voltage domain and to provide an output signal to a second voltage domain, the dynamic circuit structure comprising a dynamic node coupling a first precharge circuit, a first discharge circuit, and a gated keeper circuit; and
   a discharge delay tracking circuit to send a signal to enable the gated keeper circuit of the dynamic circuit structure in response to detecting a discharge of a node of the discharge delay tracking circuit, wherein the discharge delay tracking circuit includes the node and an output node, and wherein a first voltage of the output node is based on a second voltage of the node.

2. The voltage level shifter of claim 1, wherein operation of the gated keeper circuit is not enabled during a discharge time period.

3. The voltage level shifter of claim 1, further comprising a programmable delay circuit that delays the signal to enable the gated keeper circuit.

4. The voltage level shifter of claim 1, further comprising a plurality of dynamic circuit structures, wherein each of the plurality of dynamic circuit structures includes a corresponding gated keeper circuit responsive to the signal from the discharge delay tracking circuit.

5. The voltage level shifter of claim 1, wherein the dynamic circuit structure is integrated in at least one semiconductor die.

6. The voltage level shifter of claim 1, wherein the dynamic circuit structure is integrated within a device comprising one of a set top box, a music player, a video player, an entertainment unit, a navigation device, a communications device, a personal digital assistant (PDA), a fixed location data unit, a computer, or a combination thereof.

7. The voltage level shifter of claim 1, wherein the gated keeper circuit is enabled based on the output signal and the signal from the discharge delay tracking circuit.

8. The voltage level shifter of claim 1, wherein the node is coupled to an input of a delay circuit, and wherein the output node is coupled to an output of the delay circuit.

9. The voltage level shifter of claim 1, wherein the gated keeper circuit comprises a first p-channel field effect transistor (PFET) responsive to the output signal and a second PFET responsive to the signal from the discharge delay tracking circuit.

10. The voltage level shifter of claim 1, wherein the discharge delay tracking circuit modifies a voltage level of the node based on a clock signal and a reference voltage received at a gate of a transistor of the discharge delay tracking circuit.

11. The voltage level shifter of claim 1, wherein the discharge of the node tracks a second discharge of the dynamic node that is associated with a third voltage of the dynamic node crossing from the first voltage domain to the second voltage domain.

12. An apparatus comprising:
a dynamic circuit structure comprising a dynamic node coupling a first precharge circuit, a first discharge circuit, and a gated keeper circuit; and
a discharge delay tracking circuit to send a signal to enable the gated keeper circuit of the dynamic circuit structure in response to detecting a discharge of a node of the discharge delay tracking circuit, wherein the discharge delay tracking circuit includes the node and an output node, wherein a first voltage of the output node is based on a second voltage of the node.

13. The apparatus of claim 12, wherein the discharge delay tracking circuit includes the node coupling a second precharge circuit and a second discharge circuit, wherein the dynamic circuit structure includes a first clock input to receive a clock signal, and wherein the discharge delay tracking circuit includes a second clock input to receive the clock signal.

14. The apparatus of claim 13, wherein a first discharge time of the dynamic node is substantially equal to a second discharge time of the node.

15. The apparatus of claim 12, wherein the first discharge circuit is configured to receive a discharge signal having a first voltage level and the dynamic circuit structure is configured to provide an output at a second voltage level.

16. The apparatus of claim 15, wherein the dynamic node is biased at the second voltage level during a precharge time period and discharged during a discharge time period.

17. The apparatus of claim 12, wherein operation of the gated keeper circuit is not enabled during a discharge time period, and wherein operation of the keeper circuit is enabled after the discharge time period.

18. The apparatus of claim 12, further comprising a programmable delay circuit that delays the signal to enable the gated keeper circuit.

19. The apparatus of claim 12, further comprising a plurality of dynamic circuit structures, wherein each of the plurality of dynamic circuit structures includes a corresponding gated keeper circuit responsive to an output of the discharge delay tracking circuit.

20. The apparatus of claim 12, further comprising a memory device that includes a memory array and a dynamic driver circuit coupled to the memory array to drive a plurality of columns or wordlines of the memory array, wherein the dynamic driver circuit comprises the dynamic circuit structure.

21. The apparatus of claim 12, further comprising a device comprising one of a set top box, a music player, a video player, an entertainment unit, a navigation device, a communications device, a personal digital assistant (PDA), a fixed location data unit, a computer, or a combination thereof, into which the dynamic circuit structure is integrated.

22. The apparatus of claim 12, wherein the discharge delay tracking circuit tracks a discharge time period of the dynamic circuit structure, and wherein the discharge time period of the dynamic circuit structure corresponds to a discharge of the dynamic node.

23. The apparatus of claim 12, wherein the discharge delay tracking circuit comprises a second precharge circuit, a delay circuit, and a mimic circuit, and wherein the mimic circuit of the discharge tracking circuit is configured to mimic operation of the first discharge circuit.

24. The apparatus of claim 12, wherein the discharge delay tracking circuit comprises a second precharge circuit, a delay circuit, and a mimic circuit, and wherein the mimic circuit is configured to receive a discharge signal having a first voltage level and the discharge delay tracking circuit structure is configured to provide an output at a second voltage level.

25. The apparatus of claim 12, wherein the output node is coupled to the gated keeper circuit.

26. The apparatus of claim 12, wherein the output node is coupled to a gate of a particular transistor of the gated keeper circuit.

27. The apparatus of claim 12, wherein the signal to enable the gated keeper circuit is sent via the output node.

28. The apparatus of claim 12, wherein the discharge of the node occurs at a first time, and wherein a discharge of the output node occurs at a second time that is a delay time period after the first time.

29. The apparatus of claim 12, wherein the gated keeper circuit comprises a first transistor responsive to an output signal of the dynamic circuit structure and a second transistor responsive to the signal from the discharge delay tracking circuit.

30. The apparatus of claim 12, wherein the signal to enable the gated keeper circuit enables the dynamic circuit structure to reduce contention between the first discharge circuit and the gated keeper circuit during discharge of the node.

31. The apparatus of claim 12, wherein the gated keeper circuit is disabled during a precharge time period associated with the discharge delay tracking circuit.

32. The apparatus of claim 31, wherein the precharge time period corresponds to a time period of a logical low voltage level of a clock signal, and wherein the clock signal is provided to the discharge delay tracking circuit and to the dynamic circuit structure.

33. A method of controlling timing of a dynamic circuit, the method comprising:
generating an enable signal in response to detecting a discharge of a dynamic tracking node of a discharge delay tracking circuit, wherein the discharge delay tracking circuit shares a common clock with a dynamic circuit; and
applying the enable signal to a gated keeper circuit of the dynamic circuit to enable the gated keeper circuit of the dynamic circuit in response to the discharge of the dynamic tracking node, wherein the discharge delay tracking circuit includes the dynamic tracking node and an output node, wherein a first voltage of the output node is based on a second voltage of the dynamic tracking node.

34. The method of claim 33, further comprising:
precharging a dynamic node of the dynamic circuit during a precharge time period responsive to receiving a precharge signal at a precharge circuit of the dynamic circuit, and
precharging the dynamic node to a first voltage level and discharging the dynamic node responsive to receiving a discharge signal at the dynamic circuit, wherein the discharge signal comprises a first signal at the first voltage level and a second signal at a second voltage level.

35. The method of claim 33, wherein the enable signal is generated after a delay subsequent to detecting the discharge of the dynamic tracking node, wherein the delay is programmable, and wherein the delay is controlled via a programmable inverter circuit that includes a plurality of inverters.

36. The method of claim 33, wherein generating the enable signal and applying the enable signal to the gated keeper circuit of the dynamic circuit are performed at a processor integrated into an electronic device.

37. An apparatus comprising:
means for discharging a dynamic node of a dynamic circuit structure during a discharge time period; and
means for enabling operation of a gated keeper circuit of the dynamic circuit structure after the discharge time period in response to an enable signal that is generated in response to a discharge of a dynamic tracking node, wherein the means for enabling receives a common input clock with the dynamic circuit structure, and wherein a discharge delay tracking circuit includes the dynamic tracking node and an output node, wherein a first voltage of the output node is based on a second voltage of the dynamic tracking node.

38. The apparatus of claim 37, wherein the dynamic circuit structure is integrated in at least one semiconductor die.

39. The apparatus of claim 37, further comprising a device comprising one of a set top box, a music player, a video player, an entertainment unit, a navigation device, a communications device, a personal digital assistant (PDA), a fixed location data unit, a computer, or a combination thereof, into which the dynamic circuit structure is integrated.

40. A non-transitory computer-readable medium comprising processor-executable instructions that, when executed by a processor, cause the processor to:
generate an enable signal in response to detecting a first discharge of a dynamic tracking node of a discharge delay tracking circuit; and
apply the enable signal to a gated keeper circuit of a dynamic circuit structure to enable the gated keeper circuit in response to the first discharge of the dynamic tracking node, wherein the discharge delay tracking circuit includes the dynamic tracking node and an output node, wherein a first voltage of the output node is based on a second voltage of the dynamic tracking node.

41. The non-transitory computer-readable medium of claim 40, wherein a first discharge time of the first discharge of the dynamic tracking node is substantially equal to a second discharge time of a second discharge of a dynamic node of the dynamic circuit structure.

42. The non-transitory computer-readable medium of claim 41, further comprising processor-executable instructions that, when executed by the processor, cause the processor to apply the enable signal to a plurality of gated keeper circuits, wherein each of the plurality of gated keeper circuits corresponds to a different dynamic circuit structure.

43. The non-transitory computer-readable medium of claim 41, wherein the gated keeper circuit is not enabled during a discharge time period associated with the dynamic node, and wherein the discharge time period includes a time period to discharge the dynamic node from a third voltage to a fourth voltage.

* * * * *